(12) United States Patent
Willey

(10) Patent No.: US 8,947,141 B2
(45) Date of Patent: Feb. 3, 2015

(54) DIFFERENTIAL AMPLIFIERS, CLOCK GENERATOR CIRCUITS, DELAY LINES AND METHODS

(71) Applicant: Micron Technology, Inc., Boise, ID (US)

(72) Inventor: Aaron Willey, Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/281,712

(22) Filed: May 19, 2014

(65) Prior Publication Data
US 2014/0253193 A1 Sep. 11, 2014

Related U.S. Application Data

(62) Division of application No. 12/899,444, filed on Oct. 6, 2010, now Pat. No. 8,729,941.

(51) Int. Cl.
*H03L 7/06* (2006.01)
*H03L 7/08* (2006.01)
*H03F 3/45* (2006.01)
*H03K 5/156* (2006.01)

(52) U.S. Cl.
CPC .............. *H03L 7/08* (2013.01); *H03F 3/45183* (2013.01); *H03K 5/1565* (2013.01); *H03F 2203/45396* (2013.01)
USPC ............ 327/158; 327/149; 327/153; 327/161

(58) Field of Classification Search
USPC ........... 327/52, 53, 58, 60, 62, 63, 65–69, 71, 327/72, 74, 77–81, 88, 89, 96, 127, 246, 327/266, 274, 280, 287, 359, 560–563, 141, 327/144–163; 331/1/A, 15–17; 375/373–376

See application file for complete search history.

(56) References Cited

U.S. PATENT DOCUMENTS

| | | |
|---|---|---|
| 5,614,855 A | 3/1997 | Lee et al. |
| 6,225,863 B1 | 5/2001 | Miwa |
| 6,445,228 B1 | 9/2002 | Nguyen |
| 7,046,052 B1 | 5/2006 | Percey et al. |
| 7,148,726 B2 | 12/2006 | Oka et al. |
| 7,183,824 B2 | 2/2007 | Park et al. |
| 7,288,967 B2 | 10/2007 | Byun et al. |
| 7,528,668 B2 | 5/2009 | Kim et al. |
| 7,557,602 B2 | 7/2009 | Kim et al. |
| 7,598,783 B2 | 10/2009 | Shin et al. |
| 7,622,969 B2 | 11/2009 | Johnson |
| 7,821,310 B2 | 10/2010 | Yun et al. |
| 7,830,187 B2 | 11/2010 | Chung et al. |
| 7,956,659 B2 | 6/2011 | You et al. |
| 7,990,194 B2 | 8/2011 | Shim |
| 8,461,889 B2 | 6/2013 | Willey et al. |
| 8,493,104 B2 | 7/2013 | Willey et al. |

(Continued)

*Primary Examiner* — Brandon S Cole
(74) *Attorney, Agent, or Firm* — Dorsey & Whitney LLP

(57) ABSTRACT

A differential amplifier may be configured to have a duty cycle and/or gain that is adjustable, such as by adjusting the switch points of circuitry in the differential amplifier. The differential amplifier may alternatively or additionally have a hysteresis function by, for example, using a signal feedback from the output of the amplifier to adjust the switch points of circuitry in the differential amplifier. The differential amplifier may be used for a variety of purposes, such as in an input buffer or delay line, either of which may be used, for example, in a clock generator circuit.

16 Claims, 6 Drawing Sheets

(56) References Cited

U.S. PATENT DOCUMENTS

| | | | |
|---|---|---|---|
| 2003/0117194 A1* | 6/2003 | Lee | 327/158 |
| 2004/0046596 A1 | 3/2004 | Kaeriyama et al. | |
| 2005/0127966 A1 | 6/2005 | Lee | |
| 2005/0151565 A1 | 7/2005 | Oka et al. | |
| 2006/0127967 A1* | 6/2006 | Touitou et al. | 435/32 |
| 2006/0214689 A1 | 9/2006 | Byun et al. | |
| 2007/0109058 A1* | 5/2007 | Kim et al. | 331/45 |
| 2007/0229164 A1 | 10/2007 | Lin et al. | |
| 2008/0100355 A1 | 5/2008 | Omote | |
| 2010/0052745 A1 | 3/2010 | Chung et al. | |
| 2010/0117735 A1 | 5/2010 | Oelmaier | |
| 2011/0018600 A1 | 1/2011 | Chung et al. | |
| 2011/0050303 A1 | 3/2011 | Ma | |
| 2011/0057698 A1 | 3/2011 | Gomm et al. | |
| 2011/0234278 A1 | 9/2011 | Seo | |
| 2011/0248752 A1 | 10/2011 | Willey et al. | |
| 2012/0086488 A1 | 4/2012 | Willey | |
| 2012/0268171 A1 | 10/2012 | Willey | |
| 2013/0300475 A1 | 11/2013 | Kurd et al. | |
| 2013/0343134 A1 | 12/2013 | Willey et al. | |
| 2014/0119133 A1 | 5/2014 | Willey | |

* cited by examiner

Amplifier with DCC Function

DIFFERENTIAL AMPLIFIERS, CLOCK GENERATOR CIRCUITS, DELAY LINES AND METHODS

CROSS-REFERENCE TO RELATED APPLICATION

This application is a divisional of U.S. patent application Ser. No. 12/899,444, filed Oct. 6, 2010, issued as U.S. Pat. No. 8,729,941 on May 20,2014. This application and patent are each incorporated herein by reference, in their entirety, for any purpose.

TECHNICAL FIELD

Embodiments of this invention relate generally to clock signal generators, and more specifically, to clock signal generators in which the duty cycle of a generated clock signal may be corrected.

BACKGROUND OF THE INVENTION

Clock signals may be used in electronic circuits for timing the operation of various internal circuits. For example, in synchronous memory devices, external clock signals may be provided to a memory device and internally distributed to various circuits so that internal operations in the memory device can be synchronized to the operation of external devices. Examples of such synchronous integrated circuits include synchronous memory devices such as synchronous dynamic random access memories ("SDRAMs"), synchronous static random access memories ("SSRAMs"), and packetized memories like SLDRAMs and RDRAMs, and include other types of integrated circuits as well, such as microprocessors.

A number of different approaches have been used to synchronize internal clock signals to external clock signals, including the use of delay-locked loops ("DLLs"). Although a single clock edge transition, such as the rising edge of clock signals, may be used to control the timing of internal operations, both the rising edges and the falling edges of clock signals may also be used for this purpose. However, as the frequency of clock signals increase, variations in the duty cycle of clock signals may introduce unacceptable timing errors. Clock signals may ideally have a duty cycle of 50% so that the timing of internal operations synchronized to both the rising and falling edges of the clocks signals are equally spaced in time from each other. However, in some applications a duty cycle of other than 50% may be desired. Variations in the duty cycle from a specific value may introduce timing errors because operations that are synchronized to the falling edges of the clock signals may occur too early or too late relative to the occurrence of operations that are synchronized to the rising edge of the clock signals. For example, if the rising edges of a clock signal are used to output odd bits of read data from a memory device and the filling edges of the clock signal are used to output intervening even bits of read data, variations in the duty cycle may vary the period of time that valid read data bits are output from the memory device. Yet the duration of the period that valid read data must be provided, a parameter known as the "output hold time" and abbreviated "tOH," may have a specified minimum value. Variations in the duty cycle of a clock signal used in this manner may therefore cause the memory device to fail to meet required performance specifications.

Duty cycle correction circuits have been developed to correct duty cycle variations to a 50% or some other specific duty cycle. Prior art dynamic duty cycle or tOH correction circuits may correct the duty cycle by delaying a clock signal and adjusting the magnitude of the delay. This delay may be provided by coupling the clock signal through a large number of series-coupled logic gates or inverters, and the delay may be adjusted by varying the number of gates or inverters through which the clock signal is coupled. Unfortunately, coupling, clock signals, particularly high frequency clock signals, through a large number of gates or inverters may consume substantial power because power may be consumed as each of many gates or inverters switches responsive to each transition of the clock signal. Therefore, prior art duty cycle correction circuits used in clock generators and other circuits may consume excessive power.

DETAILED DESCRIPTION

Figure 1:
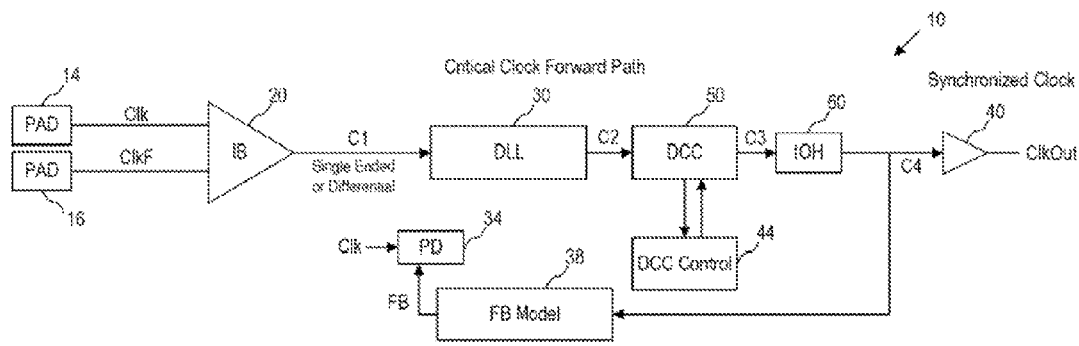
FIG. 1 is a block diagram of a prior art clock generator circuit.

FIG. 1 illustrates an embodiment of a prior art clock generator circuit 10 having a first node 14 receiving an external clock signal Clk and a second clock node 16 receiving a complementary external clock signal ClkF. These clock signals may be provided to respective inputs of a differential input buffer 20, which may output a single clock signal C1. The clock signal C1 output from the buffer 20 may have a rising edge synchronized to the rising edge of the clock signal Clk and a falling edge synchronized to the rising edge of the complementary clock signal ClkF.

The clock signal C1 may be applied to the input of a delay-locked loop (DLL) 30, which delays the clock signal C1 to generate a delay clock signal C2. The magnitude of the delay provided by the DLL 30 may be controlled by a phase detector 34, which receives a feedback clock signal FB from a model delay circuit 38. As is well known in the art, the model delay circuit 38 may compensate for delays in the input buffer 20 and in an output buffer 40. The phase detector 34 may compare the phase of the feedback clock signal FB with the phase of the external clock signal Clk, The phase detector 34 may then control the delay provided by the DLL 30 so that the feedback clock signal FB may be in phase with the external clock signal Clk.

The delayed clock signal C2 may be provided to a duty cycle correction ("DCC") circuit 50, which may be controlled by a DCC control circuit 44. As explained above, the DCC may include a substantial number of logic gates through which the delayed clock signal C2 may propagate, and it may adjust the number of gates through which the delayed clock signal C2 propagates to ensure that the duty cycle of a corrected clock signal C3 is substantially 50% or some other specific value of duty cycle. Insofar at the DCC may be continuously adjusted, it may correct dynamic duty cycle errors, which are duty cycle errors that may change as a result of, for example, changes in the temperature or supply voltage of the clock generator circuit 10.

The duty cycle of a corrected clock signal C3 may be provided to a static trim circuit 60, which may correct duty cycle errors that do not change with time but may result from, for example, process variations. The correction provided by the static trim circuit 60 may be adjusted during manufacture by, for example, opening fusible links or programming anti-fuses or the like. The static trim circuit 60 may then output a corrected clock signal C4 to the output buffer 40, which outputs a synchronized clock signal ClkOut.

As mentioned above, the large number of logic gates commonly used in the DCC 50 and/or the static trim circuit 60 may cause the clock generator circuit 10 to consume a substantial amount of power. An embodiment of a clock generator circuit 100 shown in FIG. 2 may consume substantially less power than prior an clock generator circuits. The clock generator circuit 100 may include many of the same components that are in the clock generator circuit 10 of FIG. 1. Therefore, in the interest of brevity and clarity, the same reference numerals will be used, and an explanation of their structure and operation will not be repeated. The clock generator circuit 100 differs from the clock generator circuit 10 by including a differential amplifier used as an input buffer 110 that may be controlled by a DCC Detect & Control circuit 120 to adjust the duty cycle of the clock signal C1. As a result, a clock, signal C5 applied to the output buffer 40 may have substantially no duty cycle error, i.e., the duty cycle may be substantially 50%, or it may have some other specific duty cycle. Therefore, the clock generator circuit 100 may dispense with the DCC 50 and the static delay circuit 60 used in the prior art clock generator circuit 10. Therefore, the clock generator circuit 100 does not consume the substantial power consumed by switching a large number of logic gate generally used in prior art DCCs 50 and static delay circuits 60.

The DCC Detect & Control circuit 120 is able to generate a control signal VDty for the input buffer 110 by processing a feedback clock signal FB from the model delay circuit 38. The control signal VDty may then adjust the duty cycle of the a feedback clock signal FB so that it has a substantially 50% or some other duty cycle. In making this adjustment, the DCC Detect & Control circuit 120 and input buffer 110 may compensate for any duty cycle skews generated in the DLL 30 since the duty cycle of the clock signal C1 applied to the DLL 30 may be adjusted to whatever duty cycle makes the duty cycle of the feedback clock signal FB substantially 50% or some other specific duty cycle value.

Figure 2:
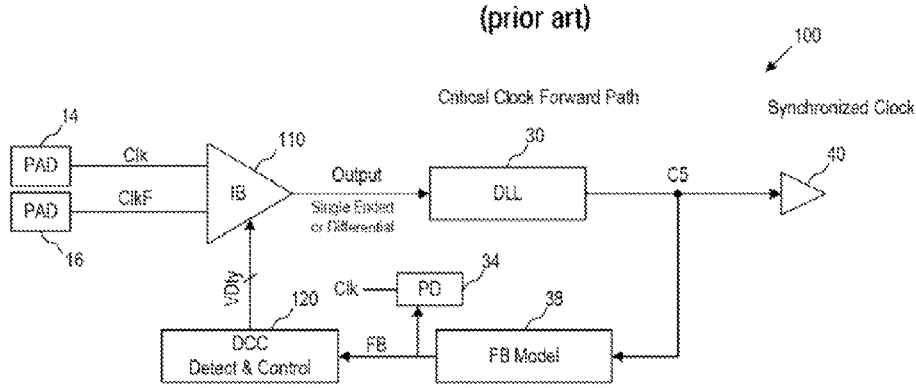
FIG. 2 is a block diagram of an embodiment of a clock generator circuit.
Figure 3:
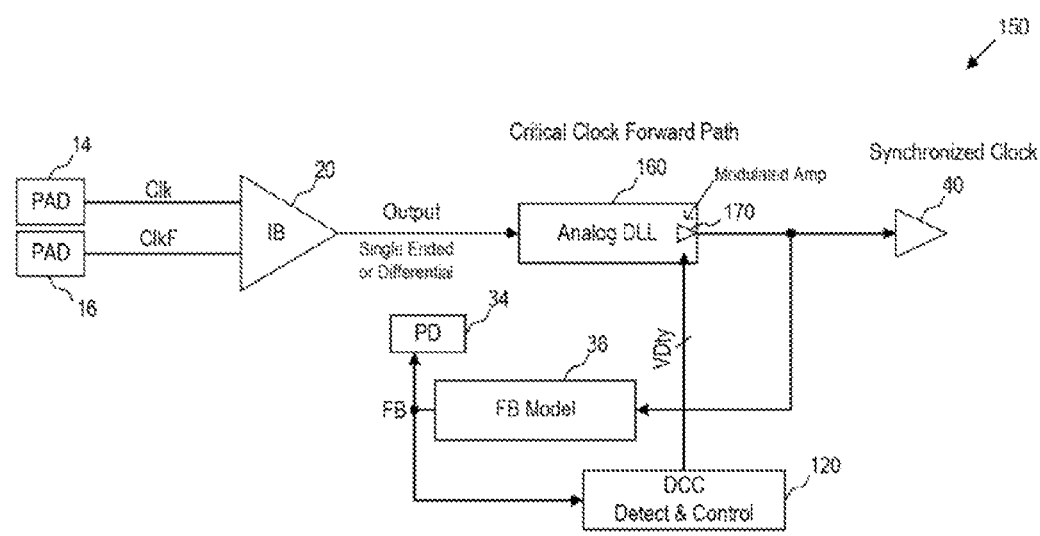
FIG. 3 is a block diagram of another embodiment of a clock generator circuit.

Another embodiment of a clock generator circuit 150 is shown in FIG. 3. Again, the clock generator circuit 150 may include many of the same components that are in the clock generator circuit 100 of FIG. 2, so that the same reference numerals will be used for those components, and a detailed explanation of them will not be repeated. Rather than using a DCC adjusting differential amplifier in the input buffer 110 as in the embodiment of FIG. 2, the clock generator circuit 150 uses a DCC adjusting differential amplifier in another portion of the clock forward clock path the path from the input nodes 14, 16 to the output of the buffer 40). Specifically, the clock generator circuit 150 may use an analog delay line 160 that includes a DCC adjusting differential amplifier 170 in one of its delay stages. In the embodiment of FIG. 3, the DCC adjusting differential amplifier 170 may be used in the last delay stage. However, in other embodiments, the DCC adjusting differential amplifier 170 may be used in other stages. Also, in the embodiment of FIG. 3, a single DCC adjusting differential amplifier 170 may be used. In other embodiments, two or more DCC adjusting differential amplifiers may be used, and they may be controlled from the same of different DCC Detect & Control circuits 120.

Figure 4:
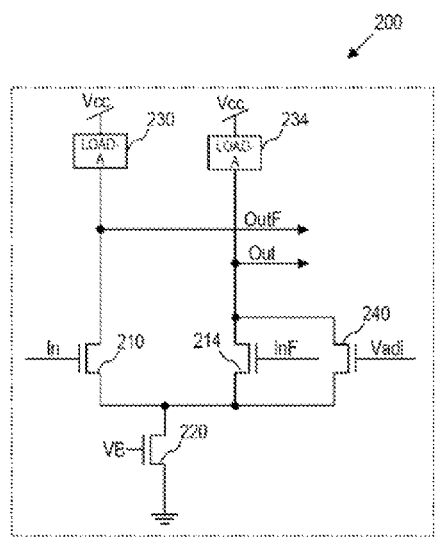
FIG. 4 is a schematic diagram of one embodiment of a differential amplifier.

The DCC adjusting differential amplifiers 110, 170 used in the clock generator circuit embodiments of FIGS. 2 and 3, respectively, may adjust the duty cycle using a variety of techniques. However, in one embodiment, the differential amplifiers 110, 170 may adjust the duty cycle of the received clock signal by adjusting the switch points of circuits used in the differential amplifier. One embodiment of a DCC adjusting differential amplifier 200 is shown in FIG. 4. The differential amplifier 200 may include a pair of differential NMOS input transistors 210, 214 having respective gates coupled to receive complementary input signals In, InF, respectively. The sources of the transistors 210, 214 may be coupled to a current source, such as an NMOS current sink transistor 220 that receives a bias voltage $V_B$ to control the total current flow through the transistors 210, 214. The drains of the transistors 210, 214 may be coupled to a supply voltage $V_{CC}$ through respective loads 230, 234 Complementary output signals Out, OutF are provided at a node between the transistor 210 and the load 230 and at a node between the transistor 214 and the load 234, respectively.

Figure 5:
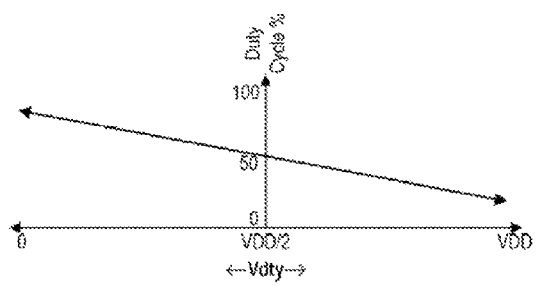
FIG. 5 is a graph showing, the duty cycle of the differential amplifier of FIG. 4 as a function of control voltage.

As explained so far the differential amplifier 200 would toggle responsive to the In and InF signals, and if the electrical characteristics of the transistors 210, 214 were identical, the duty cycle of each of the output signals would be a constant 50%. However, an NMOS duty cycle adjusting transistor 240 may be coupled in parallel with the input transistor 214 to adjust the duty cycle of the output signals Out. OutF above and below 50% as shown in FIG. 5. The transistor 240 receives a duty cycle adjustment voltage Vdty to adjust the duty cycle of the output signals Out and OutF. In one embodiment, the effective width-to-length ratio of the combined transistors 214, 240 may be substantially equal to the width-to-length ratio of the transistor 210 when the magnitude of the adjustment voltage Vdty is one-half the supply voltage $V_{CC}$. As further shown in FIG. 5, an increase in the voltage Vdty may increase the effective width-to-length ratio of the combined transistors 214, 240 so that the switch points used to generate the OutF signal are at a lower level of InF, thereby adjusting the duty cycle. Conversely, a decrease in the voltage Vdty may decrease the effective width-to-length ratio of the combined transistors 214, 240 so that the switch points used to generate the OutF signal are at a higher level of InF.

Figures 6, 7:
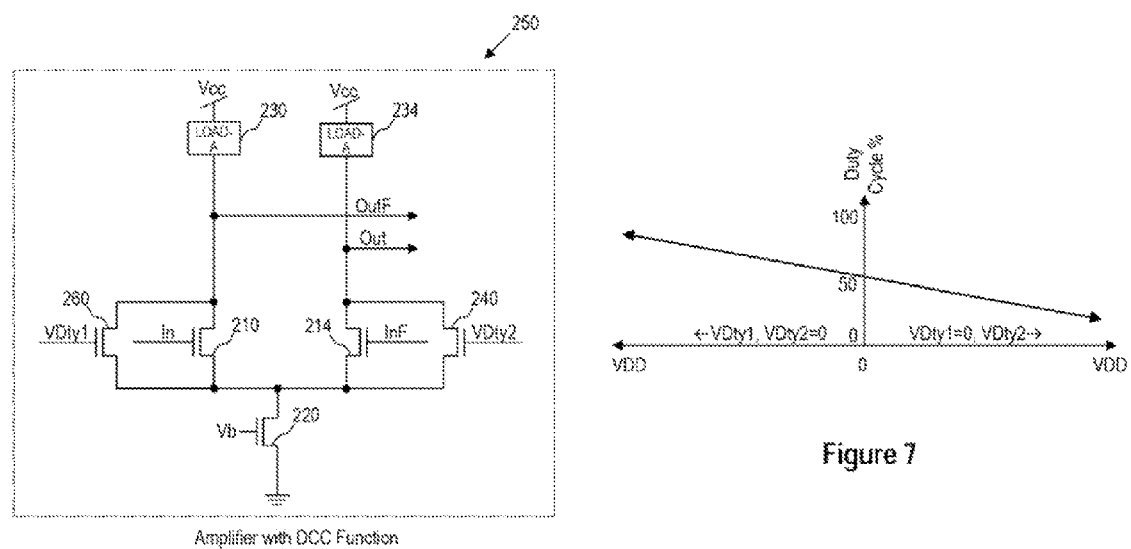
FIG. 6 is a schematic diagram of another embodiment of a differential amplifier.
FIG. 7 is a graph showing the duty cycle of the differential amplifier of FIG. 6 as a function of both control voltages.
Figure 8:
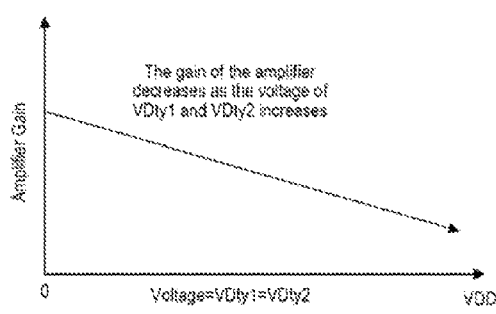
FIG. 8 is a graph showing the gain of the differential amplifier of FIG. 6 as a function of both control voltages.

Another embodiment of a DCC adjusting differential amplifier 250 is shown in FIG. 6. The amplifier 250 may include many of the same components that are in the amplifier 200 of FIG. 4, so that the same reference numerals will be used for those components, and a detailed explanation of these common components will not be repeated. The amplifier 250 differs from the amplifier 200 shown in FIG. 4 by including a NMOS duty cycle adjusting transistor 260 in parallel with the input transistor 210. As a result, the effective width-to-length ratio of the combined transistors 210, 260 may also be adjusted. The gate of the transistor 260 receives a first duty cycle adjustment voltage FBF, and the gate of the transistor 240 receives a second duty cycle adjustment voltage FB, which may be the complement of the voltage FBF. By differentially varying the adjustment voltage FB and FBF, the duty cycle of the output signals Out and OutF may be adjusted from a value, such as 50%, in either direction as shown in FIG. 7, The differential amplifier 250 may not only be capable of adjusting the duty cycle of a signal, but it may also be capable of providing a variable gain. Specifically, if the magnitude of the adjustment voltages FB and FBF are varied together rather than differentially, the gain of the amplifier 250 may also be adjusted. More specifically, as shown in FIG. 8, the gain of the amplifier 250 varies in linear inverse proportion to the magnitude of the adjustment voltages FB and FBF.

Figure 9:
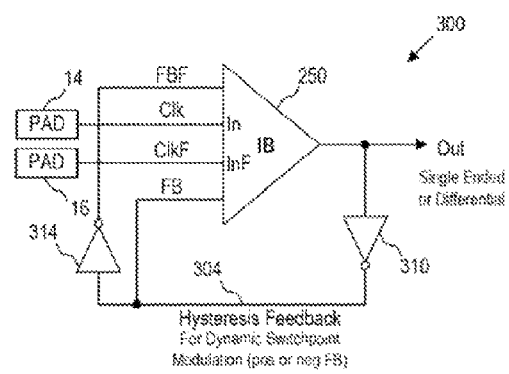
FIG. 9 is a logic diagram showing an embodiment of an input buffer having hysteresis functionality.

The differential amplifier 250 shown in FIG. 6 using, only a single output Out may also be used to implement an input buffer with hysteresis functionality. As shown in FIG. 9, an input buffer 300 may include a differential amplifier 250 (FIG. 6) in which the input nodes In, InF (FIG. 6) receive respective complementary Clk and ClkF signals from the input nodes 14, 16. The input buffer 300 may also include a feedback circuit 304 that provides complementary feedback signals FB and FBF to the inputs of the amplifier 250 to which the control signals FB and FBF were applied in the embodiment of FIG. 6. The feedback circuit 304 may include an inverter 310 through which an output signal Out from the amplifier 250 may be coupled to provide the feedback signal FB, and it may include an additional inverter 314 through which the feedback signal FB may be coupled to provide the feedback signal FBF. Insofar as the Out signal may be in phase with the Clk signal and out of phase with the ClkF signal, the feedback signal FBF may be substantially in phase with the output signal Out, and the feedback signal FB may be substantially out of phase with the output signal Out.

The ClK signal may be applied to the gate of the transistor 210 (FIG. 6), the FBF signal may be applied to the gate of the transistor 260, the ClkF signal may be applied to the gate of the transistor 214, and the FB signal may be applied to the gate of the transistor 240. In this configuration, the input to which the FB signal is applied is functionally in parallel with the ClkF signal, and the input to which the FBF signal is applied is functionally in parallel with the Clk signal. Insofar as FBF transitions high responsive to Clk transitioning high, and FB transitions low responsive to ClkF transitioning low, the FB and FBF signals may provide positive feedback to the input buffer 300.

In operation, the feedback signals FB, FBF may adjust (e.g., alter) the switch points of the differential amplifier 250 so that, which switching in each direction responsive to corresponding changes in the Clk and ClkF signals, the Clk and ClkF signals would have to change back beyond the switch point to switch the differential amplifier 250 back to its earlier state. For example, when the Clk signal transitions high beyond $V_{CC}/2$ and the ClkF signal transitions low beyond $V_{CC}/2$ the output signal Out from the differential amplifier 250 may transition high, thereby transitioning, the FB signal low and the FBF signal high. The high FBF signal increases the current flowing through the load 230 so that a Clk signal of less than VCC/2 would then be required to cause the transistor 210 to switch state. Similarly, the low FB signal decreases the current flowing through the load 234 so that a ClkF signal of greater than VCC/2 would then be required to transition the output signal Out low. Thus, the high feedback signal FBF has the effect of decreasing the low switch point of the transistor 210 below $V_{CC}/2$, and the low FB signal has the effect of increasing the high switch point of the transistor 214 above $V_{CC}/2$. As a result, the Clk signal would have to transition low beyond $V_{CC}/2$ and the ClkF signal would have to transitions high beyond $V_{CC}/2$ for the output signal Out to be switched back to a low level. The input buffer 300 responds in a similar manner for transitions of the Clk signal transitions low and transitions of the ClkF signal high.

Although the embodiment of the differential amplifier 250 used in the input buffer 300 has a single output Out, other embodiments of a differential amplifier used in an input buffer having hysteresis may provide two output signals Out and OutF as shown in FIG. 6. In such case, topologies other than that shown in FIG. 9 may be used. For example, it may be possible to eliminate one or both of the inverters 310, 314 by coupling the output signal Out directly to the gate of the transistor 260 and coupling the output signal OutF directly to the gate of the transistor 240.

Figures 10, 11:
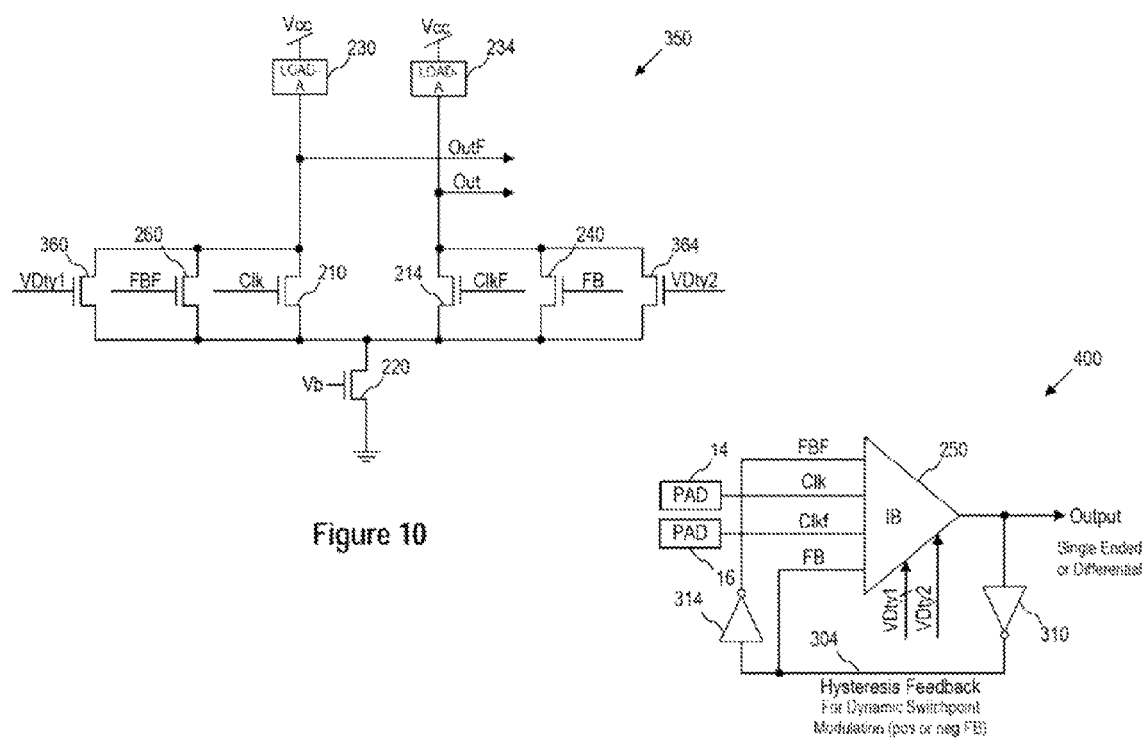
FIG. 10 is a schematic diagram of another embodiment of a differential amplifier that may have an adjustable duty cycle and gain as well as hysteresis functionality.
FIG. 11 is a logic diagram showing an embodiment of an input buffer using the differential amplifier of FIG. 10.

Another embodiment of a differential amplifier 350 is shown in FIG. 10. The differential amplifier may be identical to the differential amplifier 250 shown in FIG. 6 except that it may include an additional NMOS transistor 360 in parallel with the transistors 260 210, and an additional NMOS transistor 364 in parallel with the transistors 214, 240. The gate of the transistor 360 may receive a control signal VDty1, and the gate of the transistor 364 may receive a control signal VDty2. The control signals VDty1, VDty2 may be adjusted (e.g., altered) to adjust the gain of the differential amplifier 350.

With additional reference to FIG. 11, The differential amplifier 350 may be used to implement an input buffer 400 as shown therein by coupling, the output signal Out through the inverter 310 to generate the FB signal, which is applied to the gate of the transistor 240, and by coupling the feedback signal FB through the inverter 314 to generate the FBF signal, which is applied to the gate of the transistor 260. As a result, the duty cycle and gain of the input buffer 400 may be adjusted as explained above, and the input buffer 400 may have a hysteresis function.

As with the differential amplifier 250 used in the embodiment of the input buffer 300, the embodiment of the differential amplifier 350 used in the input buffer 400 has a single output Out. However, other embodiments of a differential amplifier used in an input buffer having hysteresis and an adjustable duty cycle and gain may provide two output signals Out and OutF as shown in FIG. 6.

Although the present invention has been described with reference to the disclosed embodiments, persons skilled in the art will recognize that changes may be made in form and detail without departing from the invention. Such modifications are well within the skill of those ordinarily skilled in the art. Accordingly, the invention is not limited except as by the appended claims.

What is claimed:

1. A clock generator, comprising:
   an input buffer configured to receive a clock signal at a signal input node and to output the clock signal at an output node;
   a delay line including an input node coupled to the output node of the input buffer, an output node, and a duty cycle control node, the delay line being configured to be responsive to a duty cycle control signal applied to the duty cycle control node to adjust a duty cycle of the clock signal being coupled through the delay line, wherein the delay line further comprises a gain control node, and wherein the delay line is configured to have a gain that is adjustable responsive to a signal applied to the gain control node;
   a phase detector having a first input node coupled to the signal output node of the delay line, a second input node coupled to receive the clock signal applied to the signal input node of the input buffer, and an output node, the phase detector being configured to adjust a delay of delay line based on a phase difference between a signal applied to the first input node and the clock signal applied to the second input node; and a duty cycle control circuit having an input node coupled to the output node of the delay line and an output node coupled to the duty cycle control node of the delay line, the duty cycle control circuit being configured to provide at the output node the duty cycle control signal corresponding to the duty cycle of the clock signal being coupled through the delay line from the input node of the delay line to the output node of the delay line.

2. The clock generator of claim 1, wherein the input node of the delay line comprises a first input node and the output node of the delay line comprises a second output node, and wherein the delay line further comprises a second input node coupled to the output node of the input buffer and a second output node, the delay line being configured to be responsive to the duty cycle control signal applied to the duty cycle control node to adjust a duty cycle of a clock signal being coupled through the delay line from the second input node of the delay line to the second output node of the delay line.

3. The clock generator of claim 2, wherein the delay line is configured to be responsive to the duty cycle control signal applied to the duty cycle control node of the delay line to adjust a duty cycle of the clock signal coupled from the first signal input node to the first signal output node in inverse proportion to the adjusting of the duty cycle of the clock signal coupled from the second signal input node to the second signal output node.

4. The clock generator of claim 1, further comprising a model delay circuit coupled between the output node of the delay line and the input node of the duty cycle control circuit.

5. The clock generator of claim 4, wherein the model delay is further coupled between the output node of the delay line and the first input node of the phase detector.

6. The clock generator of claim 1, wherein the signal input node of the input buffer comprises a first signal input node, and the signal output node of the input buffer comprises a first signal output node, and wherein the input buffer further comprises a second signal input node and a second signal output node.

7. The clock generator of claim 1, wherein the delay line comprises a delay stage that includes a differential amplifier, and wherein the differential amplifier is configured to be responsive to the duty cycle control signal.

8. A method, comprising:
coupling a first signal through a delay line;
examining a duty cycle of a second signal at an output of the delay line; and
before or during coupling the first signal through the delay line:
  adjusting, based on the examination, the duty cycle of the first signal by adjusting a switch point of a circuit through which the first signal is coupled; and
  adjusting the gain of the circuit.

9. The method of claim 8, further comprising an input buffer through which the signal is coupled prior to being coupled through the delay line, and wherein the act of adjusting the duty cycle of the signal based on the examination comprises adjusting the duty cycle of the signal in the input buffer.

10. The method of claim 8, wherein the act of adjusting the duty cycle of the signal based on the examination comprises adjusting the duty cycle of the signal in the delay line.

11. The method of claim 10, wherein the delay line comprises an analog delay line having a plurality of analog delay stages, and wherein the act of adjusting the duty cycle of the signal comprises adjusting a switch point of one of the analog delay stages.

12. An apparatus, comprising:
a delay line configured to receive an input signal and to provide an output signal that is delayed relative to the input signal, the delay line configured to adjust a duty cycle of the input signal to provide the output signal, wherein the delay line comprises a differential amplifier circuit and a feedback circuit, wherein the feedback circuit is configured to provide a feedback signal to the differential amplifier circuit, wherein the differential amplifier circuit is configured to adjust the duty cycle of the input signal to provide the output signal based on the feedback signal; and
a duty cycle control circuit configured to control adjustment of the duty cycle of the input signal through the delay line based on a duty cycle of the output signal delayed through a feedback model circuit.

13. The apparatus of claim 12, wherein the feedback circuit comprises an inverter coupled between an output node of the differential amplifier and an input node of the differential amplifier and configured to provide an inverted output signal from the output node to the input node.

14. The apparatus of claim 12, wherein the differential amplifier comprises:
a first transistor configured to receive the input signal at a first gate;
a second transistor configured to receive a second input signal at a second gate, wherein the second input signal is complementary to the input signal received at the first gate;
a third transistor configured to receive a control signal from the duty cycle control circuit at a third gate, wherein the adjustment of the duty cycle of the input signal is based on a value of the control signal, wherein the output signal is provided at a node coupled to the second transistor and the third transistor.

15. The apparatus of claim 14, wherein the control signal is a first control signal, wherein the differential amplifier further comprises a fourth transistor configured to receive a second control signal at a fourth gate, wherein the second control signal is complementary to the control signal received at the third gate, and wherein the adjustment of the duty cycle of the input signal is further based on a value of the second control signal.

16. An apparatus, comprising:
a delay line configured to receive an input signal and to provide an output signal that is delayed relative to the input signal, the delay line configured to adjust a duty cycle of the input signal to provide the output signal, wherein the delay line comprises a differential amplifier circuit that is configured to adjust the duty cycle of the input signal to provide the output signal, wherein the differential amplifier comprises:
a first transistor configured to receive the input signal at a first gate;
a second transistor configured to receive a second input signal at a second gate, wherein the second input signal is complementary to the input signal received at the first gate;
a third transistor configured to receive a first control signal from the duty cycle control circuit at a third gate, wherein the adjustment of the duty cycle of the input signal is based on a value of the first control signal, wherein the output signal is provided at a node coupled to the second transistor and the third transistor;

a fourth transistor configured to receive a second control signal at a fourth gate, wherein the second control signal is complementary to the control signal received at the third gate, and wherein the adjustment of the duty cycle of the input signal is further based on a value of the second control signal;

a fifth transistor configured to receive a first feedback signal at a fifth gate, wherein the first feedback signal is based on the output signal; and a sixth transistor configured to receive a second feedback signal at a sixth gate, wherein the second feedback signal is complementary to the first feedback signal, wherein the adjustment of the duty cycle of the input signal is further based on values of the first feedback signal and the second feedback signal; and a duty cycle control circuit configured to control adjustment of the duty cycle of the input signal through the delay line based on a duty cycle of the output signal delayed through a feedback model circuit.

* * * * *

UNITED STATES PATENT AND TRADEMARK OFFICE
CERTIFICATE OF CORRECTION

| | | |
|---|---|---|
| PATENT NO. | : 8,947,141 B2 | Page 1 of 1 |
| APPLICATION NO. | : 14/281712 | |
| DATED | : February 3, 2015 | |
| INVENTOR(S) | : Aaron Willey | |

It is certified that error appears in the above-identified patent and that said Letters Patent is hereby corrected as shown below:

In the Specification

In column 1, line 10, delete "May 20,2014." and insert -- May 20, 2014. --, therefor.

Signed and Sealed this
Fifth Day of May, 2015

Michelle K. Lee
*Director of the United States Patent and Trademark Office*